(12) United States Patent
McClelland et al.

(10) Patent No.: US 7,709,807 B2
(45) Date of Patent: May 4, 2010

(54) MAGNETO-OPTICAL TRAP ION SOURCE

(75) Inventors: Jabez J. McClelland, Bethesda, MD (US); James L. Hanssen, Silver Spring, MD (US); Marcus Jacka, York (GB); Shannon B. Hill, Gaithersburg, MD (US)

(73) Assignee: United States of America as represented by the Secretary of Commerce, The National Institute of Standards and Technology, Washington, DC (US)

( * ) Notice: Subject to any disclaimer, the term of this patent is extended or adjusted under 35 U.S.C. 154(b) by 190 days.

(21) Appl. No.: 12/116,522

(22) Filed: May 7, 2008

(65) Prior Publication Data

US 2008/0296483 A1  Dec. 4, 2008

Related U.S. Application Data

(60) Provisional application No. 60/940,997, filed on May 31, 2007.

(51) Int. Cl.
*H05H 3/00* (2006.01)
(52) U.S. Cl. .................................. 250/423 P
(58) Field of Classification Search ............... 250/423 P, 250/251

See application file for complete search history.

(56) References Cited

U.S. PATENT DOCUMENTS

| | | | |
|---|---|---|---|
| 4,327,288 A | 4/1982 | Ashkin et al. | |
| 5,528,028 A * | 6/1996 | Chu et al. | 250/251 |
| 6,476,383 B1 | 11/2002 | Esslinger et al. | |
| 6,495,822 B2 | 12/2002 | Hirano et al. | |
| 6,548,809 B2 | 4/2003 | Bouyer et al. | |
| 6,635,867 B2 | 10/2003 | Kajita | |
| 6,657,188 B1 | 12/2003 | Hulet et al. | |
| 6,680,473 B2 | 1/2004 | Ohmukai et al. | |
| 6,822,221 B2 | 11/2004 | Kumagai et al. | |
| 7,030,370 B1 | 4/2006 | Crookston et al. | |
| 7,126,112 B2 * | 10/2006 | Anderson et al. | 250/251 |
| 2007/0158541 A1 | 7/2007 | Katori | |

OTHER PUBLICATIONS

C.S. Adams et al., "Laser Cooling and Trapping of Neutral Atoms", Prog. Quant. Electr. 1997, vol. 21, No. 1, pp. 1-79, Printed in Great Britain, (79 pages).
S.B. Hill, et al. "Atoms on demand: Fast, deterministic production of single Cr atoms", Applied Physics Letters, May 5, 2003, vol. 82, No. 18, (3 pages).
J. L. Hanssen, et al. "Using laser-cooled atoms as a focused ion beam source", J. Vac. Sci. Technol. B 24(6), Nov./Dec. 2006, pp. 2907-2910, (4 pages).
J. L. Hanssen, et al., "Laser-cooled atoms as a focused ion-beam source", Physical Review A 74, 063416 (2006), (8 pages).
K.-A. Brickman, et al., "Magneto-optical Trapping of Cadmium", arXiv:0706.1608v1 [physics.atom-ph] Jun. 12, 2007, 8 pages).
Marko Cetina, et al., "Bright Source of Cold Ions for Surface-Electrode Traps", arXiv:physics/0702025v1 [physics.atom-ph] Feb. 3, 2007, (4 pages).
B. J. Claessens, et al., "Cold electron and ion beams generated from trapped atoms", Physics of Plasmas 14, 093101 (2007), (5 pages).
B. J. Claessens, et al. "Ultracold Electron Source", Physical Review Letters, PRL 95, 164801 (2005), Oct. 2005, (4 pages).

* cited by examiner

*Primary Examiner*—Kiet T Nguyen
(74) *Attorney, Agent, or Firm*—Rankin, Hill & Clark LLP

(57) ABSTRACT

A system and method are disclosed for producing a source of ions, and particularly, a focused ion beam. The system and method use a magneto-optical trap (MOT) to produce a population of neutral atoms. A laser is then utilized to ionize atoms and produce a population of ions. An extraction element is then used to transfer the ions so that they can be used in a wide array of applications.

20 Claims, 2 Drawing Sheets

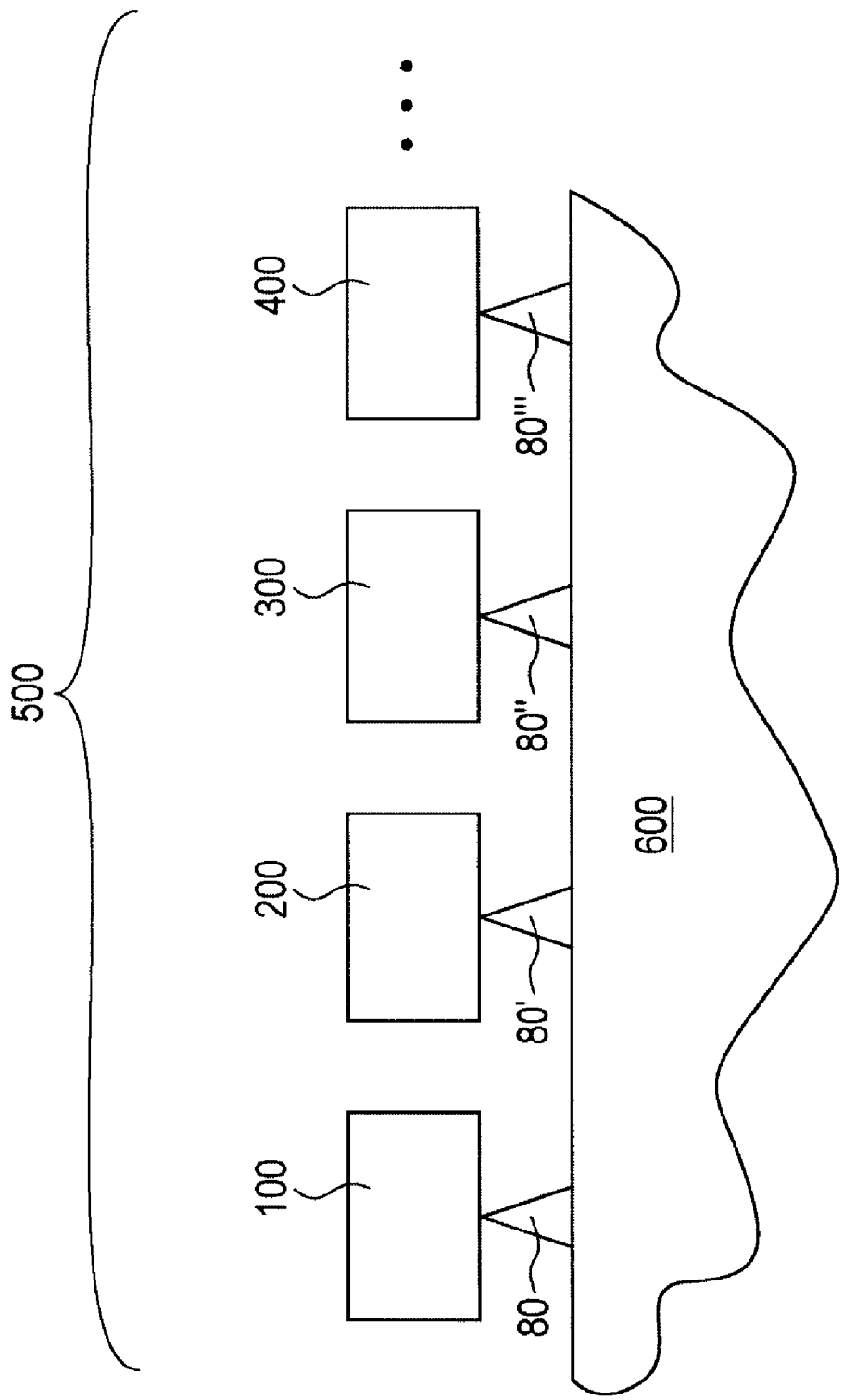

MAGNETO-OPTICAL TRAP ION SOURCE

CROSS REFERENCES TO RELATED APPLICATIONS

This application claims priority upon U.S. provisional application Ser. No. 60/940,997 filed May 31, 2007.

FIELD OF THE INVENTION

The presently disclosed embodiments are directed to the field of systems and methods for generating focused ion beams.

BACKGROUND OF THE INVENTION

For approximately 30 years, high resolution focused ion beams (FIBs) have proven useful for a variety of tasks such as microscopy, lithography, micromachining (ion milling and material deposition), and dopant implantation. Over the years, a number of ion sources have been developed for focused ion beam applications, including gas-phase, plasma, and liquid metals. Of all the sources developed to date, the liquid metal ion source (LMIS) has proven the most useful and is in the most widespread use today. The usefulness of the liquid metal ion source stems fundamentally from its very high brightness which allows the production of focused ion beams with spot sizes on the order of 10 nm while maintaining currents in the range of 1 pA to 10 pA. These characteristics give focused ion beams the necessary resolution and ion currents to perform a range of state of the art nanotechnology tasks.

Despite their widespread use, existing ion sources possess limitations that impede progress toward broader applications and higher resolution. Because of the need to wet a tungsten tip with a liquid metal, the number of different ionic species that can be implemented in a liquid metal ion source is somewhat limited. Ga is by far the predominant element used, though other species, including Ag, Al, Be, and Cs, have been demonstrated. The liquid metal ion source also suffers from an extremely large energy spread, more than several eV, which is generally considered attributable to space charge effects occurring in the very small emission area on the surface of the emitter. This energy broadening leads to chromatic aberration in the focusing optics that form the focused ion beam, thereby limiting the achievable resolution and forcing a trade off between beam current and resolution. Gas phase sources address some of these problems in that they can operate with light elements and have a narrower energy spread, on the order of 1 eV, but the current is significantly less, they do not work with heavy elements, and they are more complicated to operate. Plasma sources also overcome some of the problems of the liquid metal ion source, but their brightness is orders of magnitude less than the other two sources. A further practical issue relevant to liquid metal and gas phase sources is that the nanometer scale effective source size, required for the existing sources to have high brightness, translates into a very acute sensitivity to source positional stability, which becomes an issue in the construction of a focused ion beam system.

Accordingly, a need exists for an improved system and strategy for generating a source of ions, and particularly a focused ion beam that is suitable for a wide array of applications such as for example, site analyses, material deposition or implantation, ablation of materials, ion microscopy, secondary ion mass spectroscopy (SIMS), and ion diffraction.

SUMMARY OF THE INVENTION

The difficulties and drawbacks associated with previous-type systems are overcome in the present method and apparatus for a magneto-optical trap ion source.

In one aspect, the present invention provides a system for producing an ion source. The system comprises a magneto-optical trap having an enclosure, a component for providing a magnetic field, and at least one laser. The magneto-optical trap is adapted to produce a confined population of low temperature neutral atoms within the enclosure. The system also comprises a secondary laser adapted to emit and direct light to at least a portion of the confined population of neutral atoms. The light from the secondary laser ionizes at least a portion of the neutral atoms to thereby form a population of ions. The system additionally comprises an extraction element adapted to transfer the population of ions from the enclosure, and thereby produce the ion source.

In yet another aspect, the present invention provides an array for providing a plurality of ion beams. The array comprises a plurality of ion beam generating systems. Each system includes a magneto-optical trap having an enclosure, a component for providing a magnetic field, and at least one laser. The magneto-optical trap is adapted to produce a confined population of low temperature neutral atoms within the enclosure. The system also includes a secondary laser adapted to emit and direct light to at least a portion of the confined population of neutral atoms. The light from the secondary laser ionizes at least a portion of the neutral atoms to thereby form a population of ions. The system further includes an extraction element adapted to transfer the population of ions from the enclosure, and thereby produce the ion source.

In yet another aspect, the present invention provides a method for producing a source of ions. The method comprises providing (i) a magneto-optical trap having an enclosure, a component for providing a magnetic field, and a plurality of lasers, (ii) a secondary laser, and (iii) an extraction element. The method also comprises operating the magneto-optical trap to produce a confined population of low temperature neutral atoms within the enclosure. The method further comprises operating the secondary laser to emit light to at least a portion of the confined population of neutral atoms. The laser is configured so that the light emitted therefrom ionizes at least a portion of the neutral atoms to thereby form a population of ions. And, the method also comprises operating the extraction element to transfer at least a portion of the population of ions from the enclosure to thereby produce a source of ions.

As will be realized, the invention is capable of other and different embodiments and its several details are capable of modifications in various respects, all without departing from the invention. Accordingly, the drawings and description are to be regarded as illustrative and not restrictive.

BRIEF DESCRIPTION OF THE DRAWINGS

FIG. 2 is a schematic illustration of a preferred embodiment array in accordance with the present invention.

DETAILED DESCRIPTION OF THE EMBODIMENTS

Figure 1:
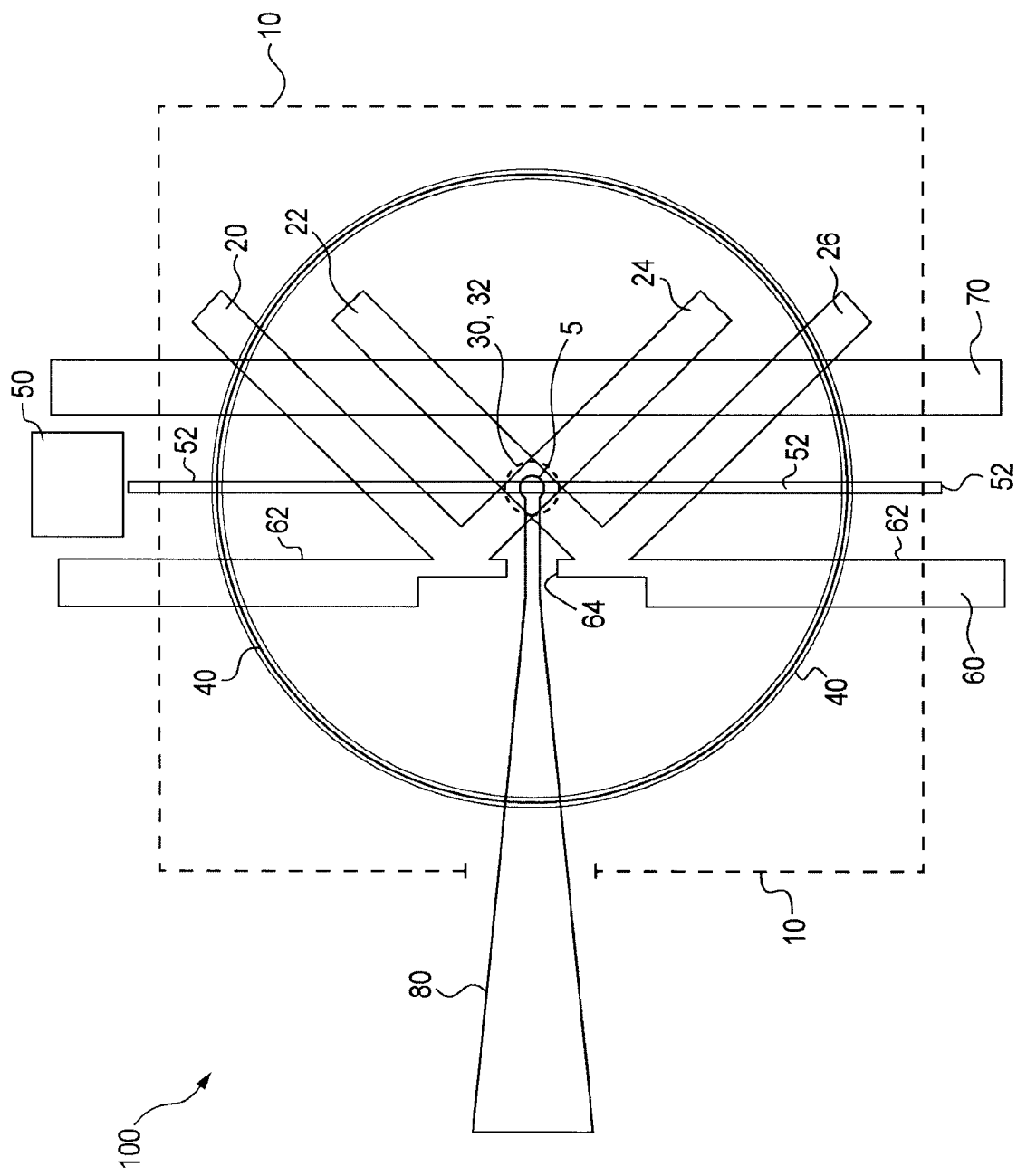
FIG. 1 is a schematic illustration of a preferred embodiment system in accordance with the present invention.

The present invention provides a new system and method for producing a focused ion beam. The present invention system comprises a magneto-optical trap (MOT), an ionizing laser, and an extraction element. In accordance with a preferred embodiment of the present invention, the magneto-optical trap produces a population or "cloud" of cold neutral atoms. The ionization laser converts the cold atoms into ions. And, the extraction element collects and transfers the ions from the magneto-optical trap in the form of an ion beam, for subsequent use. The present invention also provides an array or collection of multiple systems that preferably provide multiple ion beams in parallel. And, the present invention provides related methods of producing sources of ions or more particularly, ion beams.

In a preferred embodiment of the present invention, the magneto-optical trap generates a source of cold atoms that are photo-ionized by the laser to produce an ion cloud. Under appropriate conditions, the resulting ion cloud has temperature and spatial characteristics similar to that of an initial neutral atom cloud formed within the magneto-optical trap. The extraction element preferably generates an electric field to extract the ions. The ions can then be focused using optical techniques typically employed with charged particles. The cold temperatures achieved through laser cooling in a magneto-optical trap yield an ion beam with excellent characteristics which preferably, allow for a beam resolution of 10 nm or less. The current produced from this source depends on the operating parameters of the magneto-optical trap and can range from single ions on demand to over 100 pA, a much wider range than is possible using conventional ion sources. In addition, the wide range of elements that can be laser cooled by use of a magneto-optical trap, greatly extends the type and range of ionic species that can be generated and focused into ion beams. Hence, the present invention provides an ion source that has improved characteristics as well as expanded capabilities over current technology.

The magneto-optical trap utilized in the present invention can be a conventional laboratory system used for producing small dilute clouds of cold neutral atoms. Generally, a magneto-optical trap comprises an enclosure such as a vacuum chamber, a component for providing a magnetic field which for example may include one or more coils for generating the magnetic field, and a collection of lasers. The magneto-optical trap is configured to produce a confined population of low temperature neutral atoms within the enclosure. The geometry of a typical magneto-optical trap comprises three orthogonal pairs of counter-propagating laser beams intersecting at the center of a quadrupole magnetic field. The wavelength of the laser light is tuned close to but just below the resonance of the atom in use, creating a velocity-dependent force which slows the atoms. The magnetic field contributes position dependence to this force, creating a trap center within the overlap of the laser beams.

A magneto-optical trap can be created with any atom that has a closed (or nearly-closed) strong optical transition in which the upper level has one unit of angular momentum more than the lower level. To date, some of the elements that laser cooling has been demonstrated on are for the alkalis Li, Na, K, Rb, Cs and Fr, the alkaline earths Mg, Ca and Sr, the metastable noble gases He, Ne, Ar, Kr and Xe, the metals Al, Ag, and Cr, and the rare earths Er and Yb. It will be appreciated that this is a very active area of research with many new elements being cooled and trapped, such as cadmium and mercury. Thus, the present invention is applicable to other elements not specifically listed herein.

Within the magneto-optical trap, an atomic cloud forms having a nearly Gaussian density profile in three dimensions with a size that can range from 10 μm to a few millimeters, depending on the magnetic field gradient, the light intensity, and the number of atoms in the trap. The temperature of the atoms is generally governed by the Doppler temperature associated with the laser-cooling transition, given by $\hbar\Gamma/2k_B$, where $\Gamma$ is the natural transition rate for the cooling transition and $k_B$ is Boltzmann's constant. This temperature is typically on the order of 100 μK ($\approx$9 neV) for most magneto-optical traps. It should be noted that significantly colder temperatures can be achieved by applying more sophisticated laser cooling techniques, such as polarization-gradient cooling. The steady state number of atoms in a magneto-optical trap can vary greatly, depending on the load rate and the loss rate, with maximum values approaching $10^9$ atoms. Maximum densities are on the order of $10^{11}$ atoms/cm$^3$, limited ultimately by losses due to collisions between the excited atoms in the trap.

The present invention magneto-optical trap ion source can utilize a variety of magneto-optical traps, such as those described in U.S. Pat. No. 6,495,822 to Hirano et al. An extensive description of magneto-optical traps is provided by C. S. Adams and E. Riis, "Laser Cooling and Trapping of Neutral Atoms," *Prog. Quant Electr.*, 1997, Vol. 21, No. 1, pp. 1-79.

The present invention magneto-optical trap ion source also comprises a laser to ionize neutral atoms within the magneto-optical trap, to thereby form ions. This ionizing laser is periodically referred to herein as a secondary laser to distinguish it from the lasers used in the magneto-optical trap. The wavelength of the secondary laser is selected such that the energy of a photon from the ionization laser is just enough to ionize the atoms in the magneto-optical trap that are in the excited state. This is important for several reasons. First, it ensures that no background neutral atoms are ionized. The background atoms will be in the ground state, and therefore, photons from the ionization laser will not have enough energy to ionize them. Secondly, having just enough energy to ionize the neutral atoms ensures that no additional heating occurs. If the ionization photons have too much energy, in addition to ionizing the neutral atoms, the excess energy will heat the newly created ions. This heating will diminish the quality of the extracted ion beam and it will not have the desired emittance as described herein. Therefore, the wavelength is selected such that the energy of the cooling photon plus the energy of the ionizing photon is equal to or very close to the ionization energy of the neutral atom in the ground state. By very close, it is meant that the energy difference is equal to or less than the thermal energy of the neutral atoms within the magneto-optical trap. The power level of the laser is selected such that the ionization rate generates sufficient current. For certain embodiments, it is preferred that the ionization rate is greater than the load rate of atoms in the magneto-optical trap as described herein. The ionization rate will depend on the size of the ionization laser focus and the power. Generally, a minimum of several milliwatts of power is needed, but it is slightly dependant upon the atomic species being used. Nearly any type of laser may be used for the secondary laser, so long as the laser can produce light at the appropriate wavelength, has an appropriate linewidth, and has sufficient power. Other means of ionization are also possible, such as two-photon ionization, where two photons from the ionizing laser have just enough energy to ionize the neutral atoms, or field ionization of Rydberg states, where the ionizing laser creates a Rydberg state instead of directly ionizing the neutral atom, and this Rydberg state is ionized by an electric field.

The extraction element may be in the form of an appropriately shaped electrode or electrode assembly that fits within the magneto-optical trap geometry. That is, it is preferred that the electrode or electrode assembly be sized and shaped so that the electrode(s) is generally disposed in the enclosure of the magneto-optical trap, and positioned with respect to the population of ions formed as a result of the ionizing laser, such that the electrode(s) can withdraw ions from that region. Preferably, the electrodes are disposed within the vacuum chamber of the magneto-optical trap. At least one of the electrodes is preferably maintained at a negative electrical potential with respect to ground. This creates an electric field in the vicinity of the ion cloud that will extract ions and form them into a beam that can be coupled into standard ion optical elements for focusing. An example of standard ion optical elements are found in certain commercially available focused ion beam systems, such as for example, those available from FEI company of Hillsboro, Oreg., or Carl Zeiss A G, Oberkochen, Germany, under the designation UHV FIB subsystems.

The present invention provides an ion beam in either a continuous mode or a pulsed mode. In continuous mode, the magneto-optical trap continuously cools and traps neutral atoms. Simultaneously, the photo-ionization laser converts the trapped neutral atoms into ions. In pulsed mode operation, the magneto-optical trap is loaded with atoms until it reaches equilibrium at which point the photo-ionization laser is turned on. The magnetic field can optionally be reduced or turned off at this point. With the magnetic field left on, the source produced ions as long as the photo-ionization laser remains on. With the magnetic field reduced or turned off, the magneto-optical trap no longer loads atoms. Therefore, the photo-ionization laser will ionize the atoms at some rate determined by the properties of that laser until there are no more neutral atoms. The magneto-optical trap is then allowed to reload and the process is repeated. This will create a series of ion pulses that can be extracted into a beam.

For certain applications, it may not be desired to operate the magneto-optical trap in a continuous mode. A consequence of continuous operation is that a magnetic field is present during operation which could pose problems for some applications. Continuous operation does not diminish the quality of the resulting ion beam, but it may cause some amount of focusing which can be compensated for. Therefore, if magnetic fields are a problem for certain applications, then pulsed mode operation is possible to circumvent those problems. In pulsed mode, the magnetic field is off during ion extraction and the focusing does not occur.

Generally, the present invention provides a system for producing an ion source or an ion beam. The system comprises an enclosure defining an interior and adapted to maintain a vacuum within the interior. The system also comprises a first electrode having a reflective layer and defining an aperture extending through the electrode. The first electrode extends at least partially within the enclosure. The system further comprises a second electrode which is transparent, spaced from the first electrode, and which extends at least partially within the enclosure. The system additionally comprises at least one laser assembly adapted to emit a plurality of laser beams within the enclosure. The laser assembly is configured such that the plurality of laser beams intersect at a location within the interior of the enclosure that is between the first and second electrodes. The system also comprises current carrying coils adapted to generate a magnetic field at least partially within the enclosure. And, the system comprises a secondary laser adapted to emit a secondary laser beam within the enclosure. Upon introduction of an atom source to the interior of the enclosure, a population of low temperature neutral atoms is confined at the location between the first and second electrodes at which the plurality of laser beams intersect. The population is then ionized by the secondary laser beam and transferred through the aperture defined in the first electrode, to thereby produce the ion beam.

FIG. 1 is a schematic illustration of a preferred embodiment magneto-optical trap ion source 100 in accordance with the present invention. The preferred embodiment source 100 comprises a magneto-optical trap designated as dashed line 10. The magneto-optical trap comprises a collection of lasers such as for example six laser beams 20, 22, 24, and 26 for cooling and trapping. In this configuration of FIG. 1, two of the six laser beams project into and from the plane of the figure, and thus are depicted by the dashed circle and represented as items 30 and 32. It will be appreciated that the noted laser beams are emitted from one or more lasers (not shown in FIG. 1). Preferably, the six laser beams for the magneto-optical trap are generally formed by one laser. There are actually a number of different techniques and strategies for accomplishing such. If the source laser is powerful enough, one is sufficient. Sometimes though, only low power lasers are available. In that case, it is possible to slave several lasers together so that they have the same characteristics. It is important that they all have the same wavelength. Generally speaking though, most techniques use lasers powerful enough, such that all the beams for the magneto-optical trap can be generated by one laser. The magneto-optical trap also comprises one or more components for providing a magnetic field, which as noted may be current carrying coils for producing the magnetic field, represented as 40 in FIG. 1. The coils can be disposed within a vacuum chamber of the magneto-optical trap. However, the present invention includes embodiments in which the coils are located outside of the vacuum chamber. It will be appreciated that the particular sizes and configuration of the laser beams and magnetic coils depend upon the particular set up and characteristics desired for the magneto-optical trap. The laser beams 20, 22, 24, 26, 30, and 32, and the coils 40, serve to retain a cloud 5 of cold neutral atoms.

The present invention includes the use of one or more permanent magnets for the component providing the magnetic field. That is, instead of using coils through which electrical current is passed to generate magnetic field(s), it is contemplated that one or more permanent magnets may be used instead of, or in conjunction with, the current carrying coils. The magnetic field providing component can use one or more permanent magnets or electromagnets, or combinations thereof.

The preferred embodiment magneto-optical trap ion source 100 further comprises an ionization laser 50 which emits a beam 52 as depicted in FIG. 1. The ionization laser 50 is preferably separate from the cooling and trapping laser beams 20, 22, 24, 26, 30, and 32. The orientation of the laser 50 and laser beam 52 emitted therefrom with respect to the other laser beams is not critical. However, it is necessary that the laser beam 52 intersects the cloud 5 of cold atoms. The laser 52 preferably is focused to converge at a location inside the cloud 5 of cold atoms, but the present invention includes other configurations. The size of the laser beam 52 depends upon the particular application. For example, a relatively tightly focused beam having a diameter of about 1 to 5 micrometers can be used for low emittance applications. And, a relatively large focused beam, such as up to the size (i.e. diameter or span) of the cloud of atoms can be used for applications requiring high current and geometry characteristics.

The ionization laser 50 is preferably a separate unit from the laser of the magneto-optical trap. The ionization laser uses a wavelength significantly different than the wavelength of the cooling laser used in the trap. However, it is contemplated that potentially for certain applications, it may be possible to use a laser beam from the trap, shift its wavelength, and then use the shifted wavelength beam as the ionization laser.

The preferred embodiment magneto-optical trap ion source 100 also comprises an extraction element, which is preferably an electrode assembly 60, 70 as shown in FIG. 1. Preferably, a first electrode 60 is provided having a reflective layer 62 and which defines an aperture 64. Preferably, the electrode 60 is maintained or otherwise in electrical communication with ground. The electrode 60 includes a reflective layer 62 in order to reflect laser beams 20, 22, 24, and 26. The electrode assembly also includes a second electrode 70 that is preferably transparent or substantially so. The electrode 70 is preferably maintained or held at some electrical bias potential. This potential depends upon the particular application. For example, a positive potential may be used to extract ions and a negative potential may be used to extract electrons. However, it will be appreciated that the present invention generally includes any configuration in which two or more electrodes are appropriately electrically biased such that the resulting electric field extracts ions from the system. It is preferred that the electrode 70 is transparent or substantially so because the laser beams 20, 22, 24, and 26 typically pass through the electrode 70. However, the present invention includes a configuration in which none or only a portion of these lasers pass through the electrode 70. Preferably, the electrode 70 can be in the form of a silica window coated with indium tin oxide (ITO) which is a transparent electrical conductor. The electrodes 60, 70 are preferably disposed within the vacuum chamber of the magneto-optical trap. It will be appreciated that the extraction element can be in nearly any form. If one or more electrodes are used for the extraction element, the electrodes can be in nearly any configuration. Generally, any arrangement that creates an extraction electric field is suitable. For example, in certain embodiments, a single electrode can be used for extraction. In this embodiment, the vacuum chamber is maintained at ground potential and the single electrode is held at a negative electrical potential to thereby extract ions. In other embodiments, it may be preferred to utilize two electrodes. In this strategy, one of the electrodes is held at ground while the other electrode is held at a positive potential to thereby create an electric field that extracts ions. The present invention includes the use of one, two, or more appropriately biased electrodes to extract ions from within the system.

Referring further to FIG. 1, operation of the preferred embodiment source 10 will now be described. Atoms in the cloud 5 are cooled and trapped by the laser beams 20, 22, 24, 26, 30, and 32, and the magnetic coils 40. The laser beam 52 ionizes the atoms within the cloud 5 of the cold atoms. The electrodes 60 and 70 create a well defined, uniform electric field that extracts the ions. The resulting ion beam is shown in FIG. 1 as beam 80. Beam 80 passes through the aperture 64 defined in the electrode 60 and propagates outward as desired. Beam 80 constitutes the ion source in accordance with the present invention.

An aspect not depicted in FIG. 1 is a neutral atom source. In order to trap and cool atoms, a source of neutral atoms is needed. The source of neutral atoms is usually in the form of a diffusive oven. Other typical sources of neutral atoms include, but are not limited to, gas jets, in particular metastable noble gasses, vapor cell sources, and laser ablation sources. Metastable gas sources is an active area of current research. There are requirements on the orientation of the atom source with respect to the system. It is preferred that the beam of neutral atoms not be perpendicular to any of the cooling and trapping laser beams otherwise there would be an undesirable background ion beam with poor characteristics. Also, in cases where the neutral atom species can cause damage, the beam of atoms should be parallel to the electrode surfaces so that atoms do not impact them. There is no restriction on the orientation of the ionization laser beam with respect to the neutral atom beam.

Thus, in certain embodiments, the present invention includes a source of neutral atoms. The source is configured to introduce the particular atoms into the magneto-optical trap. The particular element(s) selected are typically dictated by the application. Such as for example, light elements to thereby provide light ions are preferred for the source for applications such as microscopy. Heavy elements to thereby provide heavy ions are preferred for the source for applications such as ion milling. Metals may also be preferred to provide metal ions. And, certain elements may be preferred to provide dopant atoms. Examples of preferred light elements include, but are not limited to, He, Li, Be or Bo. Examples of preferred heavy elements include, but are not limited to, Ar, Kr, or Xe. Examples of preferred metals include, but are not limited to, Na, K, Rb, Cs, Mg, Ca, Sr, Ba, Cr, Ag or Er. Examples of preferred doping elements include, but are not limited to, Si, P or Sb.

The present invention is well suited to parallelization using existing micro-fabrication technology. Current ion-milling systems using a liquid metal ion source can create feature sizes below 10 nm, but this technology is not practical for high volume production of semiconductor devices because it is an inherently serial printing technique. For optimal impact in the semiconductor industry, a direct write technique such as ion milling must be able to create hundreds of patterns in parallel. Accordingly, the present invention provides a magneto-optical trap ion source array formed by extension of existing techniques used to create single optically cooled atom traps near a surface. This would involve using well established micro-fabrication techniques to create arrays of current carrying wires or permanent magnet material and reflective surfaces on a substrate to provide the magnetic and optical fields required to form the magneto-optical traps. The extraction and focusing electrodes can be similarly integrated into the same substrate resulting in an array of dozens to hundreds of individually controllable ion mills using the present invention magneto-optical trap ion source. This type of direct write array has the potential to mill hundreds of identical or different patterns with critical dimensions of about 10 nm at potentially high volume production rates. Similarly, using the much lower current rates uniquely achievable with the present invention magneto-optical trap ion source, this array can also be used to provide parallel controlled doping of the semiconductor material with near single dopant atom accuracy. This type of tailored doping is projected to be of critical importance as the transistor junctions become small enough that statistical variations in bulk doped Si begin to affect device performance.

FIG. 2 is a schematic illustration of a preferred embodiment array 500 in accordance with the present invention. The array 500 comprises a plurality of ion beam generating systems, such as the preferred embodiment magneto-optical trap ion source 100 described herein and depicted in FIG. 1. The array 500 also comprises additional ion sources shown as 200, 300, 400 . . . etc. Each of the additional sources is preferably identical or at least similar to the source 100. The plurality of sources emit a plurality of ion beams shown in FIG. 2 as beams 80, 80' 80" and 80'''. The array 500 can be used in numerous applications as described herein, such as performing multiple operations in parallel upon a workpiece or substrate 600. For example, a system or an array of ion beam generating systems including a magneto-optical trap as described herein, a secondary laser as described herein, and an extraction element as described herein can be provided. A second ion beam generating system including a second magneto-optical trap, a second secondary laser, and a second extraction element, all of which as previously described herein, can also be provided. The first and the second ion beam generating systems are configured such that the ion beams produced therefrom are in parallel. Preferably, the plurality of ion beams produced from the array are emitted in directions parallel to one another, or substantially so. However, the present invention array is not limited to such a configuration and may include a non-parallel configuration. Preferably, the plurality of ion beams produced from the array are produced concurrently. However, the present invention also includes non-concurrent operations of ion beam generating systems constituting the array. Additional ion beam generating systems can be further provided in parallel. Although the present invention array includes nearly any number of ion beam generating systems, it is preferred that the number range from 2 to about 1000, and more preferably from 3 to 100 for example.

Without wishing to be bound to any particular theory that may limit the present invention, the following is presented to more fully describe the operation and design of the preferred embodiment magneto-optical trap ion sources. The two quantities used to characterize the quality of an ion beam are the normalized emittance, $\epsilon$, and the brightness, B. For a source in a field free region with a Gaussian spatial distribution characterized by a standard deviation, $\sigma_x$, and a Maxwellian velocity distribution in the x direction characterized by a temperature T, the normalized emittance, $\epsilon_x$, reduces to:

$$\varepsilon_x = \sigma_x \sqrt{\frac{k_B T}{2}} . \tag{1}$$

Applying this expression to a typical magneto-optical trap with $\sigma_x$=5 μm and T=100 μK, Equation (1) yields a value of $\epsilon_x \approx 3.3 \times 10^{-7}$ π mm mrad $\sqrt{\text{MeV}}$. This normalized emittance is three times smaller than the measured normalized emittance value for a gallium liquid metal ion source operated in high resolution mode, $\epsilon_x \approx 10.7 \times 10^{-7}$ π mm mrad $\sqrt{\text{MeV}}$. It is important to note that for the liquid metal ion source to reach its lowest emittance, the beam must be apertured, a process that reduces the current output to the order of 10 pA. For the present invention magneto-optical trap ion source, the emittance (and hence resolution) is independent of the current because the emittance is not reduced through aperturing, as long as space charge is not significant.

Using the emittance, it is possible to calculate the expected spot size attainable using the present invention magneto-optical trap ion source, assuming it is coupled with a typical focusing column. For a perfect lens, the spot size is entirely dictated by the emittance of the ion beam, but for a realistic lens, aberrations limit the final resolution. The final spot radius, $r_{total}$, is taken to be a root-power-sum of the various contributions including aberrations. It can be shown that the minimum spot size for a given normalized emittance is:

$$r_{total} \approx \gamma C_{SA}^{1/4} \epsilon^{3/4} U^{-3/8} \tag{2}$$

where γ is a numerical factor of order unity, $C_{SA}$ is the coefficient characterizing spherical aberration, and U is the energy of the beam at the focus. Using Equation (2) with the above calculated emittance, a beam energy of 1 keV, and assuming a realistic spherical aberration coefficient of 200 mm rad$^{-3}$, results in a spot radius of approximately 3.8 nm.

While emittance highlights the quality of the beam, brightness measures the useful current that can be focused into a spot. Brightness depends on the amount of current, I, that is emitted from an area, A, into an solid angle, Ω, and takes the form:

$$B = \frac{d^2 I}{d\Omega dA} \tag{3}$$

Since the solid angle can change as a function of beam energy, a more useful quantity is the normalized brightness, β=B/U. The normalized brightness is related to emittance by:

$$\beta = \frac{I}{\varepsilon_x \varepsilon_y} \tag{4}$$

where $\epsilon_x$ and $\epsilon_y$ are the emittances in the two orthogonal directions transverse to the direction of propagation. This quantity is also invariant along the focusing column. Therefore, by knowing the brightness of a source it is possible to calculate how much current can be focused into a spot.

In order to calculate the brightness of the present invention magneto-optical trap ion source, it is necessary to estimate, identify, or otherwise arrive at the amount of current it can provide. This is generally dependent on the load rate of the magneto-optical trap, the excited state population, the photo-ionization rate, and whether the source is operated in a pulsed or continuous mode. In a pulsed mode of operation, the cloud of atoms is exposed to the photo-ionization laser long enough to ionize a significant fraction of the atoms and then is shut off while the trap reloads. The number of atoms in the trap can range from one atom to the order of $10^9$ atoms, and the photo-ionization rate can be as high as $2.5 \times 10^6$ s$^{-1}$. Using these values, it is possible to estimate a maximum current pulse of 0.25 mA with a duration of 0.4 μs.

A continuous mode of operation is also possible. In this case, the photo-ionization laser illuminates the atom cloud, continuously ionizing atoms and ejecting them from the magneto-optical trap while new atoms are loaded into the trap. Now the current is set by the loading rate of the magneto-optical trap. Depending on the atomic species and the magneto-optical trap operating conditions, the loading rate can range from a few atoms per second to as high as $10^9$ s$^{-1}$. This upper value corresponds to a current of 160 pA. While this is lower than the peak current in pulsed mode, it is significantly higher than the 10 pA of current that a typical liquid metal ion source produces in high resolution mode.

The calculated currents demonstrate that the present invention magneto-optical trap ion source is indeed a high brightness source. With the pulsed current estimate of 0.25 mA and the continuous current estimate of 160 pA, the source can be shown to have normalized brightnesses of $1.6 \times 10^{13}$ A cm$^{-2}$ sr$^{-1}$ MeV$^{-1}$ (pulsed), or $1.5 \times 10^{11}$ A cm$^{-2}$ sr$^{-1}$ MeV$^{-1}$ (continuous). These values surpass the measured brightness values of $5.8 \times 10^7$ A cm$^{-2}$ sr$^{-1}$ MeV$^{-1}$ for a gallium liquid metal ion source, $2 \times 10^{10}$ A cm$^{-2}$ sr$^{-1}$ MeV$^{-1}$ for gas-phase ion sources, and $10^5$ A cm$^{-2}$ sr$^{-1}$ MeV$^{-1}$ for plasma sources.

The present invention for producing a focused ion beam, provides additional capabilities due to the use of laser cooling techniques in the magneto-optical trap. Specifically, the invention includes all additional capabilities the source possesses due to advanced laser cooling techniques. For example, these capabilities include attaining lower temperatures through polarization gradient cooling; the provision of a dual ion/electron source through change of polarity in the magneto-optical trap; the use of multiple atomic elements; the provision of a deterministic single ion source through atom-on-demand technology, as described for example in S. B. Hill and J. J. McClelland, *Appl. Phys. Lett.* 82, 3128 (2003); and ability for parallelization to form an array of ion sources.

Of particular significance, is the use of the present invention systems and methods in conjunction with atom-on-demand technology. That is, the present invention can be utilized to produce single ions as desired. Thus, by use of the present invention magneto-optical trap ion source and the particular detection and feedback strategies described in the previously noted work by S. B. Hill and J. J. McClelland, *Appl. Phys. Lett.* 82, 3128 (2003), rapid periodic extraction of single ions can be achieved. The single ion source can then for example, be used for deterministic doping.

The present invention provides numerous advantages over currently available technology, such as for example, the present invention magneto-optical trap ion source has lower emittance and higher current output than available sources yielding a higher brightness source. This should allow for finer resolution with higher currents. In addition, the emittance is current independent.

In addition, due to the extended source size, space charge effects are significantly reduced. The energy spread of the resulting beam is due to the extraction field present at the time of ionization. Energy spreads should be of the order 100 meV. The much smaller energy spread reduces chromatic aberration, allowing for higher resolution and lower beam energies.

Furthermore, a much wider range of atomic species can be used to create a focused ion beam using the present invention magneto-optical trap ion source. All the elements that can be laser cooled can be used as an ion source, thereby significantly increasing the capabilities of focused ion beams. These currently include the alkalis Li, Na, K, Rb, Cs and Fr, the alkaline earths Mg, Ca and Sr, the metastable noble gases He, Ne, Ar, Kr and Xe, the metals Al, Ag, and Cr, and the rare earths Er and Yb. This list continues to grow as more research is done in this field.

The present invention magneto-optical trap ion source can also be used as a dual source. By changing the polarity of the focusing column, either ions or electrons can be extracted and focused to high resolution.

A much larger range of beam currents are available using the present invention magneto-optical trap ion source. By incorporating advanced laser cooling techniques, currents ranging from individual ions up to the order of 100 pA are possible. This allows for precise doping at levels not currently possible.

Efforts to parallelize existing electron and ion sources have been ongoing for several years, but seem to be fundamentally limited in resolution, current and uniformity due to chromatic aberrations, space-charge effects and the unstable nature of field-emission electron sources and liquid metal ion sources. Chromatic aberrations and space charge effects would have much less of an effect in the present invention magneto-optical trap ion source due to the lower energy distribution and larger spatial extent of the atom-cloud source. The output current of each of the present invention magneto-optical trap ion source in an array could also be easily controlled and optimized in a feedback loop by tuning the individual currents that generate the magnetic fields or by adjusting the intensity or frequency of the lasers.

Unlike existing lithographic techniques, the patterns created by a parallelized present invention magneto-optical trap ion source array would not require expensive, defect-free masks, making the present invention ideal for rapid high resolution circuit prototyping.

A single magneto-optical trap ion source in accordance with the present invention can operate as a compact source for ion enhanced secondary electron emission microscopy. An array using the present invention magneto-optical trap ion source, with similarly parallelized position sensitive electron detectors near the focus could rapidly image multiple areas of a sample in parallel. This would be ideal for detection of defects on large wafers containing many individual patterns.

Many other benefits will no doubt become apparent from future application and development of this technology.

All patents, published patent applications, and articles referred to herein, are hereby expressly incorporated by reference in their entirety.

As described hereinabove, the present invention solves many problems associated with previous type devices. However, it will be appreciated that various changes in the details, materials and arrangements of parts, which have been herein described and illustrated in order to explain the nature of the invention, may be made by those skilled in the art without departing from the principle and scope of the invention, as expressed in the appended claims.

What is claimed is:

1. A system for producing an ion source, the system comprising:
   a magneto-optical trap having an enclosure, a component providing a magnetic field, and at least one laser, the magneto-optical trap adapted to produce a confined population of low temperature neutral atoms within the enclosure;
   a secondary laser adapted to emit and direct light to at least a portion of the confined population of neutral atoms, wherein the light from the secondary laser ionizes at least a portion of the neutral atoms to thereby form a population of ions; and
   an extraction element adapted to transfer the population of ions from the enclosure, and thereby produce the ion source.

2. The system of claim 1 wherein the component for providing a magnetic field includes current carrying coils which upon passing an electrical current therethrough, generate the magnetic field.

3. The system of claim 1 wherein the component for providing a magnetic field includes at least one permanent magnet.

4. The system of claim 1, wherein the extraction element is also adapted to form the transferred population of ions into a beam.

5. The system of claim 1, wherein the extraction element is an electrode disposed at least partially within the enclosure, the electrode being at a negative electrical potential with respect to ground, whereby an electric field is generated within the enclosure to thereby extract the population of ions and transfer the ions from the enclosure.

6. The system of claim 1 wherein the extraction element includes:
   a first electrode;
   a second electrode spaced from the first electrode;
   wherein the first and second electrodes are disposed such that the confined population of neutral atoms is between the first and second electrodes, the first electrode defining an aperture through which at least a portion of the population of ions passes.

7. The system of claim 6 wherein the first electrode includes a reflective layer.

8. The system of claim 6 wherein the second electrode is transparent.

9. The system of claim 6 wherein the first electrode and the second electrode are each electrically biased such that the resulting electric field extracts ions from the system.

10. The system of claim 1 wherein the system produces a continuous ion beam.

11. The system of claim 1 wherein the system produces a series of ion beam pulses.

12. The system of claim 1 further comprising:
a source of neutral atoms, the source adapted to introduce the neutral atoms into the magneto-optical trap, the neutral atoms selected from the group consisting of (i) light elements, (ii) heavy elements, (iii) metals, and (iv) doping elements.

13. The system of claim 12 wherein the neutral atoms of the source is a light element selected from the group consisting of He, Li, Be and B.

14. The system of claim 12 wherein the neutral atoms of the source is a heavy element selected from the group consisting of Ar, Kr, and Xe.

15. The system of claim 12 wherein the neutral atoms of the source is a metal selected from the group consisting of Na, K, Rb, Cs, Mg, Ca, Sr, Ba, Cr, Ag, and Er.

16. The system of claim 12 wherein the neutral atoms of the source is a doping element selected from the group consisting of Si, P, and Sb.

17. The system of claim 1 wherein the magneto-optical trap, the secondary laser, and the extraction element constitute a first ion beam generating system, the system further comprising a second ion beam generating system provided in parallel with the first ion beam generating system, the second ion beam generating system including a second magneto-optical trap, a second secondary laser, and a second extraction element, whereby the first ion beam generating system and the second ion beam generating system provide ion beams in parallel.

18. An array for providing a plurality of ion beams, the array comprising:
a plurality of ion beam generating systems, each system including (i) a magneto-optical trap having an enclosure, a component providing a magnetic field, and at least one laser, the magneto-optical trap adapted to produce a confined population of low temperature neutral atoms within the enclosure; (ii) a secondary laser adapted to emit and direct light to at least a portion of the confined population of neutral atoms, wherein the light from the secondary laser ionizes at least a portion of the neutral atoms to thereby form a population of ions; and (iii) an extraction element adapted to transfer the population of ions from the enclosure, and thereby produce an ion source.

19. A method for producing a source of ions, the method comprising:
providing (i) a magneto-optical trap having an enclosure, a component for providing a magnetic field, and a plurality of lasers, (ii) a secondary laser, and (iii) an extraction element;
operating the magneto-optical trap to produce a confined population of low temperature neutral atoms within the enclosure;
operating the secondary laser to emit light to at least a portion of the confined population of neutral atoms, the laser configured so that the light emitted therefrom ionizes at least a portion of the neutral atoms to thereby form a population of ions; and
operating the extraction element to transfer at least a portion of the population of ions from the enclosure to thereby produce a source of ions.

20. The method of claim 19 wherein the operating of the extraction element is performed by applying an electrical potential to the extraction element with respect to ground, to thereby generate an electric field within the enclosure and extract the population of ions and transfer them from the enclosure.

* * * * *